United States Patent [19]

Hatayama et al.

[11] Patent Number: 4,926,052

[45] Date of Patent: May 15, 1990

[54] RADIATION DETECTING DEVICE

[75] Inventors: Tamotsu Hatayama, Matsudo; Yujiro Naruse, Yokohama, both of Japan

[73] Assignee: Kabushiki Kaisha Toshiba, Kawasaki, Japan

[21] Appl. No.: 21,349

[22] Filed: Mar. 3, 1987

[30] Foreign Application Priority Data

| | | | |
|---|---|---|---|
| Mar. 3, 1986 | [JP] | Japan | 61-45958 |
| Apr. 24, 1986 | [JP] | Japan | 61-95413 |
| Sep. 4, 1986 | [JP] | Japan | 61-206832 |

[51] Int. Cl.[5] .................. G01T 1/24

[52] U.S. Cl. .................. 250/370.14; 250/370.01; 250/370.02

[58] Field of Search .......... 250/370 G, 370 K, 370 R, 250/370.01, 370.02, 370.08, 370.09, 370.14; 357/30 C, 30 H, 30 K, 15, 4, 29, 51

[56] References Cited

U.S. PATENT DOCUMENTS

| | | | |
|---|---|---|---|
| 2,847,585 | 8/1958 | Christian | 250/370 X |
| 2,879,400 | 3/1959 | Schneeberger | 250/370 G X |
| 3,396,318 | 8/1968 | Chow | 250/370 X |
| 3,598,997 | 8/1971 | Baertsch | 250/370 K |
| 3,757,123 | 9/1973 | Archer et al. | 250/370 K X |
| 3,864,722 | 2/1975 | Carnes | 250/370 K |
| 3,946,151 | 3/1976 | Kamiyama et al. | 357/30 H X |
| 4,210,805 | 7/1980 | Kobayashi et al. | 250/370 G X |
| 4,531,055 | 7/1985 | Shepherd, Jr. et al. | 250/370 K X |
| 4,651,001 | 3/1987 | Harada et al. | 250/370 K |
| 4,678,938 | 7/1987 | Nakamura | 357/30 H X |
| 4,714,950 | 12/1987 | Kawajiri et al. | 357/30 K |
| 4,785,186 | 11/1988 | Street et al. | 250/370.01 X |

FOREIGN PATENT DOCUMENTS

| | | | |
|---|---|---|---|
| 2609731 | 9/1976 | Fed. Rep. of Germany | 357/30 H |
| 58-118163 | 7/1983 | Japan . | |
| 1018402 | 1/1966 | United Kingdom . | |

OTHER PUBLICATIONS

Brodsky, "Contact Barriers to Semiconductor Crystals", IBM Tech. Disclosure Bulletin, vol. 17, No. 6, Nov. 1974, pp. 1814–1816.

Patent Abstracts of Japan, vol. 6, No. 258 (P-163) [1136], Dec. 17, 1982 & JP-A-57 154 083 (Yokogawa Denki Seisakusho K.K.) 09-22-1982.

IEEE Nuclear Science, vol. NS-33, No. 1, Feb. 1986, pp. 351-354, IEEE New York, U.S.; S. N. Kaplan et al.: "Detection of charged particles in amorphous silicon layers" *p. 351: "Detector material"; p. 352, col. 1, lines 1-5 bottom of col. 2; FIGS. 3, 4*.

*Primary Examiner*—Eugene R. LaRoche
*Assistant Examiner*—Seung Ham
*Attorney, Agent, or Firm*—Oblon, Spivak, McClelland, Maier & Neustadt

[57] ABSTRACT

A solid state radiation detector has semiconductor layers and metal layers which are stacked along the incident direction of radiation rays. Each metal layer is made of a specific metal material which receives radiation rays entering itself and produces free photoelectrons by interactions therewith. The photoelectrons are introduced into the semiconductor layer, and excite it, thereby producing electron-hole pairs therein. The metal layers serve not only as radiation detecting layers but also as electrodes for collecting the electron-hole pairs. Therefore, when the produced electron-hole pairs are derived from the metal layers, an electrical radiation detecting signal may be produced.

19 Claims, 10 Drawing Sheets

20
10
16a
14a
18a
16b
14b
14c
18b
12

RADIATION DETECTING DEVICE

BACKGROUND OF THE INVENTION

The present invention relates to a radiation detecting device and, more particularly, to a solid state radiation detector for detecting radiation rays by using interaction occurring when radiation rays entering the detector pass through the detector.

A "radiation detector" is a general name of devices for detecting radiation rays by utilizing a phenomenon occurring when radiation rays, such as $\alpha$ rays, $\beta$ rays, and $\gamma$ rays, and elementary particles, atomic nuclei, protons, and the like, which move with energy equivalent to or higher than these rays, pass through a specific material. Various radiation detectors are proposed, and each detector can be used for various purposes by changing its performance or shape. The radiation detectors may be classified into a gas detector, a liquid detector, and a solid state detector in accordance with materials for generating electrical signals upon detection of radiation rays.

In recent radiation detectors which are incorporated in various industrial products such as a radiation CT scanner (computed tomography scanner), rolled plate thickness measurement machine, and the like, a solid state radiation detector is primarily used. This is because, the solid state radiation detector is compact in size, has excellent reliability, and can be manufactured with relatively low cost. However, the conventional solid state radiation detector has poor conversion efficiency of radiation rays into signal charge carriers. As a result, it is difficult to improve a detection sensitivity to a required level.

For example, according to a conventional multichannel radiation detector suited for the X-ray CT scanner, the radiation detector has a scintillator and a semiconductor radiation detecting element in a collimator for defining each channel. The semiconductor radiation detecting element comprises a silicon substrate which is sandwiched between a Schottky junction metal layer for forming a depletion layer as a sensitive section at an interface between itself and the substrate, and an ohmic contact metal layer for outputting an electrical signal. Incident radiation rays are directly detected by the semiconductor radiation detecting element. The incident radiation rays passing through the detecting element are then guided to the scintillator, and the scintillator emits light. The scintillation light is detected by the semiconductor radiation detecting element.

With this prior art, the incident radiation rays are subjected to two-step detection, i.e., direct detection by means of the semiconductor radiation detecting element, and indirect detection using the scintillation light. Thus, it may be considered that the conversion efficiency of the radiation rays is relatively good. However, since the depletion layer of the semiconductor detecting element as the sensitive section is formed only on one surface of the substrate, the conversion efficiency of the radiation rays still remains low. Therefore, its detection sensitivity is low. If the size of the semiconductor detecting element is increased to several centimeters, the detection sensitivity may be improved to some extent. However, this renders the detector undesirably bulky.

As another prior art device, a semiconductor radiation detector having a pin junction type amorphous silicon layer is known. More specifically, an n-type amorphous silicon layer, an intrinsic amorphous silicon layer, a p-type amorphous silicon layer, and a transparent conductive electrode layer are sequentially stacked on a substrate. By this detector, when incident radiation rays pass through the pin junction type amorphous silicon layer, electron-hole pairs are produced in the silicon layer by a photovoltaic interaction. Since the electron-hole pairs can move about in the silicon layer, if an appropriate electric field is applied to the silicon layer, the electron-hole pairs can be read out. Therefore, electrical pulses of a detection signal can be obtained.

With the detector of this type, however, the conversion efficiency of the radiation rays at the pin junction type amorphous silicon layer is not so high, and the radiation ray detection sensitivity is low. In order to improve the detection sensitivity, the amorphous silicon layer portion must have an extremely large thickness (e.g., the thickness of the intrinsic amorphous silicon layer must be increased to several centimeters). This is because if the thickness of the amorphous silicon layer portion is commonly set to be several micrometers, radiation rays cannot be absorbed by the amorphous silicon layer portion, and almost all the rays pass through the silicon layer portion. In this manner, it is difficult even for latest film formation technology to allow the manufacture of a uniform amorphous silicon layer having an extremely large thickness. If it can be manufactured, carriers produced in the amorphous silicon layer cannot be derived as electrical detection signals since carrier lifetime and carrier mobility of the carriers inside the silicon layer are low.

SUMMARY OF THE INVENTION

It is therefore an object of the present invention to provide a new and improved solid state radiation detecting device which is superior in conversion efficiency for converting incident radiation rays into electrical charges.

It is another object of the present invention to provide a new and improved solid state radiation detecting device which is superior in detection sensitivity of incident radiation rays and can be easily manufactured without using a specific manufacturing technique.

In accordance with the above objects, the present invention is addressed to a specific solid state radiation detecting device which is basically composed of a semiconductor layer and a metal layer formed thereon. The metal layer receives radiation rays which enter therein, and produces free energy particles based on their interactions. The energy particles include photoelectrons, photons, fission fragments, or the like. The photoelectrons are introduced into the semiconductor layer, and excite it, thereby producing electron-hole pairs therein. The metal layer serves not only as a radiation detecting layer interacting with the radiation rays but also as a collecting electrode for collecting the electron-hole pairs. Therefore, when the electron-hole pairs are derived from the metal layer, an electrical radiation detecting signal may be produced.

The above and other objects and advantages of the present invention will become more apparent from the detailed description of a preferred embodiment presented below.

BRIEF DESCRIPTION OF THE DRAWINGS

In the detailed description of a preferred embodiment of the invention presented below, reference is made to the accompanying drawings in which.

DETAILED DESCRIPTION OF THE PREFERRED EMBODIMENTS

Figure 1:
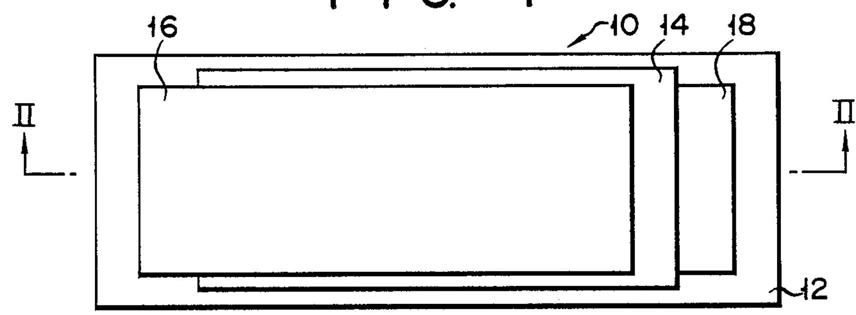
FIG. 1 is a diagram showing a main planar structure of a solid state radiation detector according to a preferred embodiment of the present invention.
Figure 2:
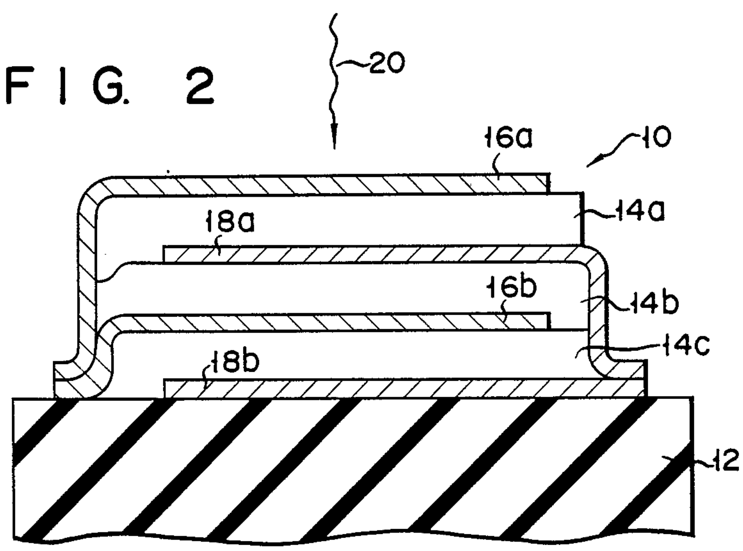
FIG. 2 is a diagram showing a sectional structure taken along line II—II in the radiation detector shown in FIG. 1.

Referring now to FIGS. 1 and 2, a solid state radiation detector as a first embodiment of the present invention, which is generally designated by numeral 10, has insulative substrate 12. Substrate 12 may be a quartz glass substrate. Radiation detecting cells (to be referred to simply as a "cell" hereinafter) having a multi-layered structure, in which semiconductor layers and metal layers are alternately disposed, are arranged on substrate 12. The semiconductor layers may be undoped amorphous semiconductor layers 14, and the metal layers consist of Schottky junction metal layers 16 and ohmic contact metal layers 18.

Each cell has undoped amorphous semiconductor layer 14, Schottky junction metal layer 16 which is provided on one surface of layer 14 to form a Schottky junction therewith and forms a Schottky barrier at an interface portion between itself and layer 14, and ohmic contact metal layer 18 which is formed on the other surface of layer 14 to be in ohmic-contact therewith. These layers are alternately stacked, as clearly illustrated in FIG. 2. Metal layers 16 and 18 made of certain metals which are selected from metallic elements whose atomic numbers are 30 or higher, and which can produce photoelectrons therein due to the photoelectron effect. In this embodiment, amorphous silicon layer 14 is an undoped amorphous silicon layer, Schottky junction metal layer 16 is a gold (Au) layer, and ohmic contact metal layer 18 is a molybdenum (Mo) layer.

More specifically, undoped amorphous silicon layers 14*a*, 14*b*, and 14*c* are stacked above one surface of insulative substrate 12. Two adjacent layers of amorphous silicon layers 14*a*, 14*b*, and 14*c* are alternately brought into contact with each other at their one end sides. In the sectional view of FIG. 2, only three amorphous silicon layers are illustrated for the sake of simplicity. In practice, however, many layers are stacked as will be described later. (In FIG. 2, layers are denoted with suffixes "a", "b", "c", . . . along the incident direction of radiation ray 20, i.e., in the downward direction from the top portion of the multi-layered structure).

Each amorphous silicon layer 14 is sandwiched by corresponding Schottky junction metal layer 16 and ohmic contact metal layer 18. Schottky junction metal layers 16*a* and 16*b* and ohmic contact metal layers 18*a* and 18*b* are alternately formed between amorphous silicon layers 14*a*, 14*b*, and 14*c*. Schottky junction metal layers 16*a* and 16*b* are electrically connected to each other at their one end sides (one side portion of the multi-layered structure). Ohmic contact metal layers 18*a* and 18*b* are also connected to each other at their one end sides (the opposite side portion of the multi-layered structure). Therefore, the cross-sectional view of FIG. 2 illustrates as if these metal layers 16 and 18 are two sets of tooth-shaped layers which are spatially meshed with each other. It can be thus considered that the cells are electrically connected in parallel with each other.

Schottky junction metal layers (i.e., Au layers) 16 and ohmic contact metal layers (i.e., Mo layers) 18 may be uniformly formed using a sputtering method or a vacuum deposition method as a popular film formation method for those skilled in the art. Amorphous silicon layers 14 may be formed by plasma-chemical vapor deposition using the glow discharging decomposition technique of $SiH_4$, $Si_2H_6$, photo-chemical vapor deposition using photo-excitation, and the like. In this embodiment, the thickness of each amorphous silicon layer 14 is set to be 5 $\mu$m, the thickness of each Au metal layer 16 is set to be 2 $\mu$m, and the thickness of each Mo metal layer 18 is set to be 1 $\mu$m. The total thickness of the multi-layered structure of radiation detector 10 is set to be several millimeters.

The principle of operation of the radiation detector having the above multi-layered structure will be described below. X-rays 20 as incident radiation rays are guided by a known waveguiding means (not shown) so as to be vertically incident on amorphous silicon layers 14, Schottky junction metal layers 16, and ohmic contact metal layers 18, as shown in FIG. 2.

When the photon flux of X-rays 20 is incident on uppermost Schottky junction metal layer 16*a*, X-rays 20 interact with metal layer 16*a*. At this time, in metal layer 16*a*, interaction phenomena such as photoelectric absorption, Compton scattering, Rayleigh scattering, and the like are induced, there by producing photoelectrons therein. It should be noted that the Compton scattering and Rayleigh scattering which occur at the same time as photoelectric absorption in metal layer 16*a* are extremely small so as to be ignorable as compared with photoelectric absorption. Thus, photoelectrons produced in metal layer 16a are mainly caused by photoelectric absorption. Therefore, photoelectrons have energy substantially equal to the X-ray photon energy.

The photoelectrons thus produced are discharged from Schottky junction metal layer 16a and are then introduced into the underlying first amorphous silicon layer 14a. Since the film thickness of metal layer 16a is set to be smaller than the range of photoelectrons, the photoelectrons are efficiently guided to amorphous silicon layer 14a. The photoelectrons incident in amorphous silicon layer 14a excite this layer 14a, and produce electron-hole pairs therein. Since the electron-hole pairs are collected by metal layer 16a, layer 16a also serves as a signal charge collecting layer.

The X-ray photon stream which partially lost its energy due to interaction (i.e., photoelectric absorption) in metal layer 16a passes through amorphous silicon layer 14a substantially without losing its energy. The X-ray photon stream then reaches the underlying metal layer, i.e., first ohmic contact metal layer 18a. The X-rays interact with metal layer 18a, and photoelectrons are produced in metal layer 18a in the same manner as in metal layer 16a. The photoelectrons are guided to the underlying semiconductor layer, i.e., second amorphous silicon layer 14b, and excite layer 14b, thereby producing electron-hole pairs therein. Since the electron-hole pairs are collected by metal layers 16b and 18a, these metal layers serve as signal charge collecting electrodes. The X-ray photon stream transmitting through silicon layer 14b is incident on the underlying metal layer, i.e., second Schottky junction metal layer 16b.

Photoelectrons are sequentially produced in the remaining metal layers 16b, 18c, . . . in the same manner as described above. As a result, electron-hole pairs are produced in the corresponding amorphous silicon layers. The reason why the X-ray photon stream passes through stacked amorphous silicon layers 14a, 14b, and 14c without interactions is that the atomic number of silicon (Si) is smaller than those of ohmic contact metal layers 18. In addition, the energy of the X-ray photon stream is several tens of kilo electron volts (KeV), and this value is 10,000 times (i.e., $10^4$ times) that of normal photons (i.e., several electron volts (eV)). Therefore, resonance absorption by the forbidden bands of amorphous silicon layers 14 will not occur.

The photoelectron production process and electron-hole pair production process are repeated in the above-mentioned cells, and the incident radiation rays, i.e., X-rays 20, are effectively absorbed by the detector. Thus, X-rays 20 are converted to electron-hole pairs which serve as signal charges. The electron-hole pairs collected by metal layers 16 and 18 are electrically parallel-derived, and are converted to an electrical pulse current for producing a radiation detecting signal. As described above, the total thickness of the multi-layered structure of radiation detector 10 is large, i.e., several millimeters. Therefore, even if the semiconductor layers for producing electron-hole pairs are amorphous layers, the electron-hole pairs produced therein can be highly efficiently collected by metal layers 16 and 18.

Figure 3:
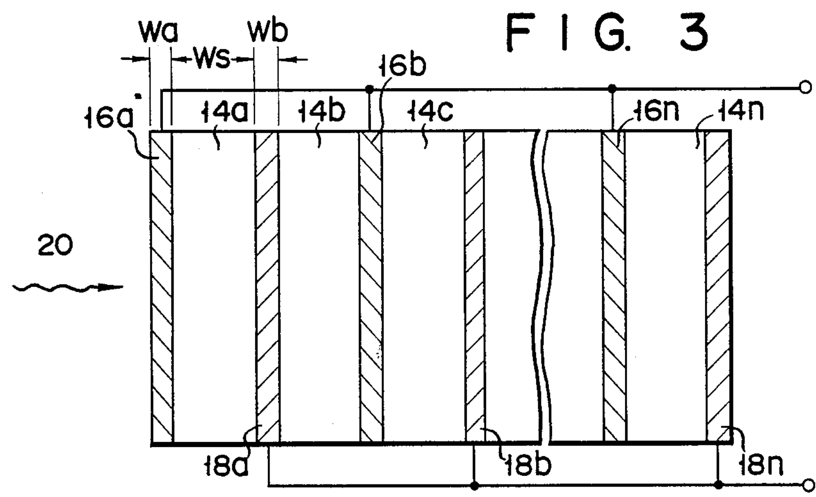
FIG. 3 is a representation illustrating the multi-layered structure of the radiation detector shown in FIGS. 1 and 2 in order to allow visual understanding.

The theoretical analysis results for the detection sensitivity of this radiation detector is presented below. FIG. 3 shows radiation detector 10 used for this analysis. As shown in FIG. 3, the film thickness of first metal layer 16 is given as "Wa", the film thickness of amorphous silicon layer 14 is given as "Ws", and the film thickness of second metal layer 18 is given as "Wb". The number of stacked layers of the cells is assumed to be "N". In this case, the table below shows an attenuation coefficient of X-ray photons in layers 14, 16, and 18, an energy absorption coefficient, an electron range in the case of electron energy of 50 KeV.

TABLE

| | Total Attenuation Coefficient | Energy Absorption Coefficient | Electron Range |
|---|---|---|---|
| Metal Layer 16 | $\mu t(a)$ | $\mu e(a)$ | Ra |
| Silicon Layer 14 | $\mu t(s)$ | $\mu e(s)$ | Rs |
| Metal Layer 18 | $\mu t(b)$ | $\mu e(b)$ | Rb |

If the probability of X-ray photon interaction in one metal layer 16 is given as Pa, the probability of X-ray photon interaction in the other metal layer 18 is given as Pb, and the probability of X-ray photon interaction in amorphous silicon layer 14 is given as Ps:

$$Pa = (P0 - P1) + (P4 - P5) + \ldots + (P(2N-2) - P(2N-1))$$

$$Ps = (P1 - P2) + (P3 - P4) + \ldots + (P(2N-1) - P(2N))$$

$$Pb = (P2 - P3) + (P6 - P7) + \ldots + (P(2N) - P(2N+1))$$

If $P0=1$, $P1=\exp\{-\mu t(a)Wa\}$ $P2=P1\exp\{-\mu t(s)Ws\}$ $P3=P2\exp\{-\mu t(b)Wb\}$ P4 and thereafter can be expressed in the same manner as described above. Note that the above-mentioned interaction mainly corresponds to photoelectric absorption, and the effect due to only photoelectric absorption is taken into consideration hereinbelow. Effective energy Ef at which the interactions in the respective layers, i.e., photoelectrons produced by photoelectric absorption can be utilized for producing electron-hole pairs in the amorphous silicon layers is expressed using photoelectron energy as Ee as follows:

$$Ef \approx Pa\cdot\{\mu e(a)/\mu t(a)\}\cdot[2Ws/Rs\{E(1-Wa/Ra)\}]\cdot(1-\{(Wa/Ra)\}\cdot Ee+Pb\{\mu e(b)/\mu t(b)\}\cdot[2Ws/Rs\{E(1-Wb/Rb)\}]\cdot\{(1-(Wb/Rb)\}\cdot Ee+Ps\cdot\{\mu e(s)/\mu t(s)\}\cdot(Ws/Rs)\cdot Ee$$

The first and second terms of the right side of the above equation represent energies at which photoelectrons are produced in metal layers 16 and 18 and are effectively utilized as electron-hole pairs in next amorphous silicon layer 14, and the third term represents energy at which photoelectrons are produced in amorphous silicon layer 14 and are consumed for producing electron-hole pairs. This can be obtained as follows. First, the probability where the X-ray photon interacts with metal layer 16 and this interaction corresponds to photoelectric absorption is:

$$Pa\cdot\mu e(a)/\mu t(a)$$

Next, photoelectrons produced in metal layer 16 lose energy until they reach amorphous silicon layer 14, and the energy is decreased to an average value:

$(1-Wa/Ra)Ee$

Figure 4:
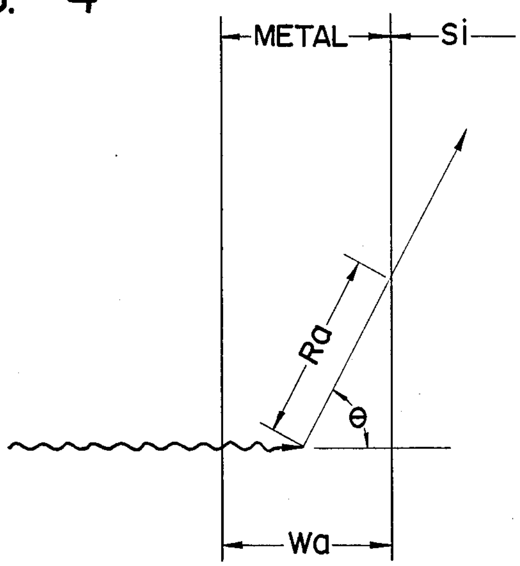
FIG. 4 is a representation showing the multi-layered structure of a metal layer and a semiconductor layer used for explaining photoelectric absorption effect by photons of X-rays.

The reason for this will be explained with reference to FIG. 4. Photoelectrons produced in metal layer 16 upon X-ray photon incidence (indicated by wavy line in FIG. 4) are discharged at an angle of about 60° if $Ee \approx 50$ KeV. Upon travel inside metal layer 16 for distance Wa, they lose energy of about (Wa/Ra)Ee. Ra is an electron range, and if photoelectrons travel over a distance corresponding to range Ra, the energy of photoelectrons is decreased to zero. Photoelectrons reaching the interface between metal layer 16 and amorphous silicon layer 14 have the following range in amorphous silicon layer 14.

$$Rs\{Ee(1-Wa/Ra)\}$$

This is a range function depending on energy. Therefore, energy utilized for producing electron-hole pairs in distance Ws over which photoelectrons propagate straight at angle $\Theta$ of about 60° until they collide next metal layer 18 is a $2Ws/Rs\{E(1-Wa/Ra)\}$ multiple of $(1-Wa/Ra)Ee$. If $2Ws/Rs\{E(1-Wa/Rs)\}>1$, photoelectrons are stopped in the amorphous silicon layer, and this value is fixed to be 1. The effective energy where the photoelectrons produced in metal layer 16 are utilized for producing electron-hole pairs in amorphous silicon layer 14 is represented as the first term of the aforementioned equation.

Similarly, the effective energy which is consumed by photoelectrons produced in the other metal layer 18 to produce electron-hole pairs in amorphous silicon layer 14 is represented by the second term of the above equation.

The X-ray photons which interact with amorphous silicon layer 14 consume average energy of (Ws/Rs)Ee for producing electron-hole pairs. The probability of photoelectric absorption in amorphous silicon layer 14 is:

$$Ps \cdot \mu e(s)/\mu t(s)$$

As a result, energy where photoelectrons are produced in this silicon layer 14 and are used for producing electron-hole pairs is represented by the third term of the above equation.

Figure 5:
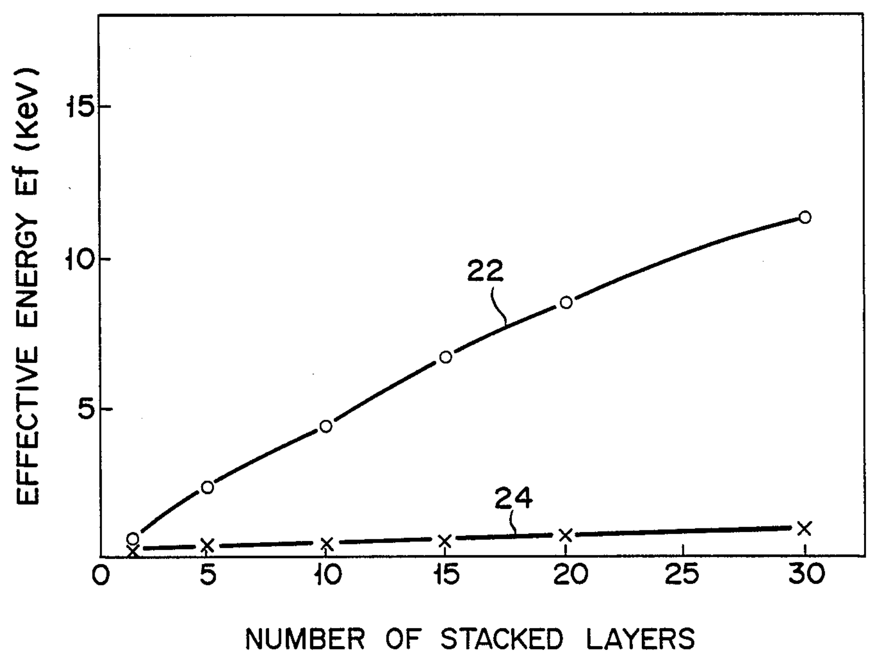
FIGS. 5 to 8 are graphs showing characteristic measurement results associated with an effective energy of the radiation detector of the present invention.

FIG. 5 shows the results when a change in effective energy Ef in detailed example No. 1 is calculated for number N of stacked layers of a unit cell (represented by curve 22). In example No. 1, the film thickness of Au film 16 is Wa=1 μm, the total attenuation coefficient is μt(a)=96.5/cm, the ratio of photoelectric absorption coefficient μe(a) to total attenuation coefficient μt(a) is 14.4/16.5, and the electron range is Ra=5.11 μm. The film thickness of Mo film 18 is Wb=2 μm, the total attenuation coefficient is μt(b)=69.7/cm, the ratio of photoelectric absorption coefficient μe(b) to total attenuation coefficient μt(b) is 10.3/10.9, and the electron range is Rb=7.35 μm. The film thickness of amorphous silicon layer 14 is Ws=5 μm, the total attenuation coefficient is μt(s)=0.985/cm, the ratio of photoelectric absorption coefficient μe(s) to total attenuation coefficient μt(s) is 9.9/19.6, and the electron range is Rs=23.85 μm. Comparative example No. 1 shown in FIG. 5 (the characteristic curve thereof is denoted by 24) is a sample having only an amorphous silicon layer, and the film thickness thereof is the same as the total thickness of example No. 1. The incident X-ray photon energy is 50 KeV.

As can be seen from the graph of FIG. 5, according to example No. 1 of the detector having the multi-layered structure of the present invention, photoelectrons produced by photoelectric absorption are effectively utilized for producing electron-hole pairs in the amorphous silicon layer, and a high X-ray detection sensitivity can be obtained such that the number of stacked layers of the unit cell is appropriately selected. The major reason why the effective energy is small in comparative example No. 1 is that the total attenuation coefficient and the photoelectric absorption coefficient of the amorphous silicon layer are small, and probability Ps where X-ray photons interact with the amorphous silicon layer is much smaller than probabilities Pa and Pb in the metal layers.

Figure 6:
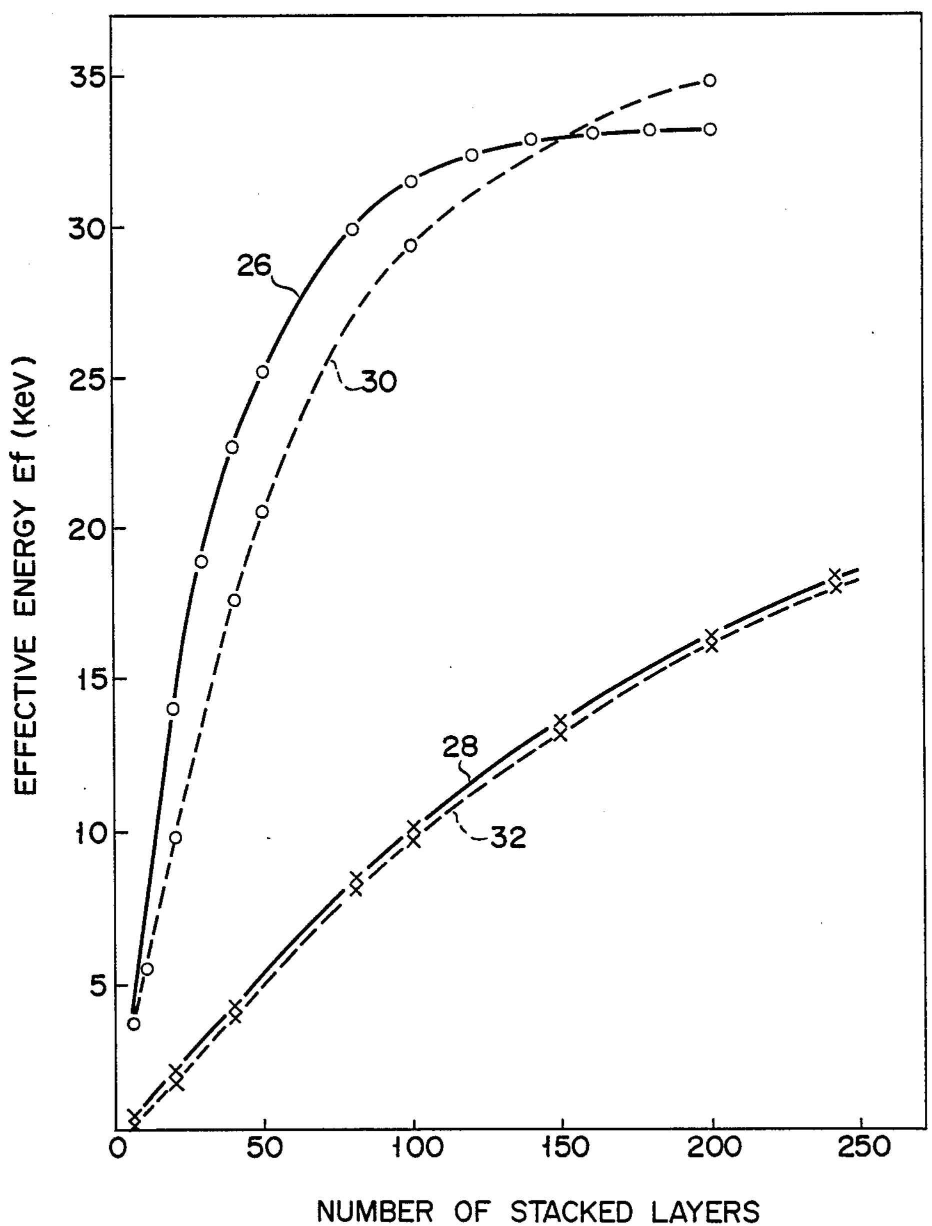

FIG. 6 shows the measurement results of a change in effective energy Ef when the film thicknesses in the structure of example No. 1 of the present invention are changed, and the number of stacked layers is increased. More specifically, in example No. 2 (curve 26), the film thickness of Au film 16 is Wa=1 μm, the film thickness of Mo film 18 is Wb=2 μm, and the film thickness of amorphous silicon layer 14 is Ws=25 μm. In example No. 3 (curve 30), Wa=0.5 μm, Wb=1.0 μm, and Ws=25 μm. In comparative Example Nos. 2 and 3 (curves 28 and 32), radiation detectors each comprise amorphous silicon layers having thicknesses corresponding to those in examples Nos. 2 and 3.

As can be seen from the graph shown in FIG. 6, in example Nos. 2 and 3, if number N of stacked layers=100, large energy of 29 to 30 KeV half or more X-ray photon energy of 50 KeV can be effectively used for producing electron-hole pairs in the amorphous silicon layer. The effective energy when the number of stacked layers is 100 is equal to or higher than that of an image intensifier which is currently used in the medical field and has the highest effective energy obtainable at present. In addition, since the film thickness of the amorphous silicon layer of the unit cell is 25 μm, electron-hole pairs produced in the amorphous silicon layer can be externally derived as an electrical signal with high collection efficiency. When the number of stacked layers is 100, the total thickness of the amorphous silicon layer is 2.5 mm in both example Nos. 2 and 3. This is the great practical advantage. For example, in order to obtain a desired detection sensitivity in an X-ray detector using monocrystalline silicon, a thickness of several centimeters in the incident X-ray direction is necessary.

Figure 7:
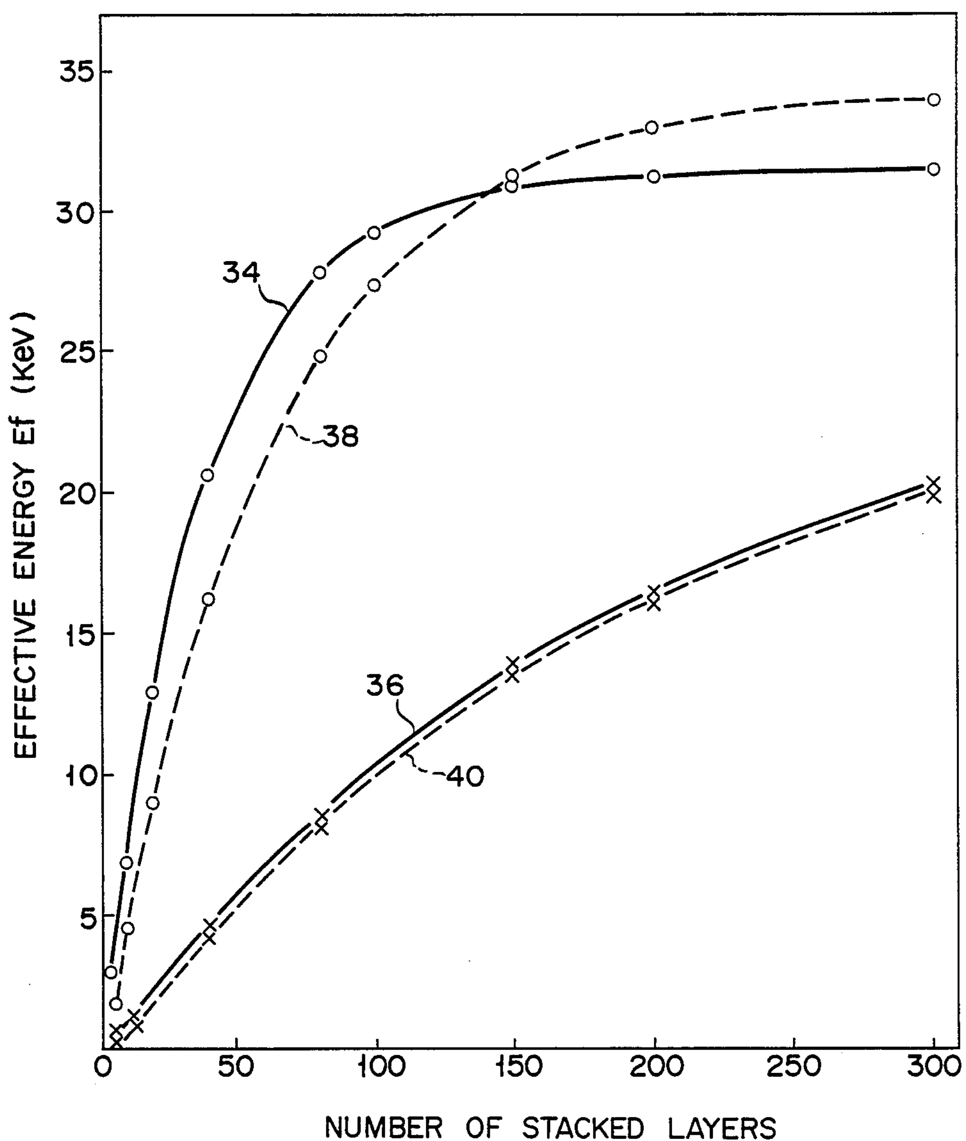

FIG. 7 shows the measurement results when a Ta film is used instead of Au film 16, and effective energy Ef is calculated in the same manner as in FIG. 6. In example No. 4 (curve 34), the film thickness of the Ta film is Wa=1 μm, the film thickness of Mo film 18 as the other metal layer is Wb=2 μm, and the film thickness of amorphous silicon layer 14 is Ws=25 μm. Similarly, in example No. 5 (curve 38), Wa=0.5 μm, Wb=1.0 μm, and Ws=25 μm. In comparative example Nos. 4 and 5 (curves 36 and 40), radiation detectors each comprise amorphous silicon layers having thicknesses corresponding to those in examples Nos. 4 and 5. Note that the total attenuation coefficient of Ta is μt(a)=83.8/cm, the ratio of photoelectric absorption coefficient μe(a) to the total attenuation coefficient μt(a) is 11.6/13.4, and the electron range is Ra=5.06 μm.

Since the atomic number of Ta is smaller than that of Au, effective energy Ef is decreased accordingly as compared to the previous examples. In this case, the effectiveness of the present invention is also noticeable.

The optimal value of the film thickness of the metal layer in the present invention will be examined below. If the film thickness of the metal layer is set to be larger than the electron range of photoelectrons produced, most of the photoelectrons are lost in the metal layer, and do not contribute to effective energy Ef. If number N of stacked layers is predetermined, if the metal layer is too thin, the total interaction probability with the X-ray photons is decreased, and contribution to effective energy Ef is impaired. Therefore, an appropriate film thickness of metal layer should be present in terms of the relationship between itself and the number of stacked layers.

Figure 8:
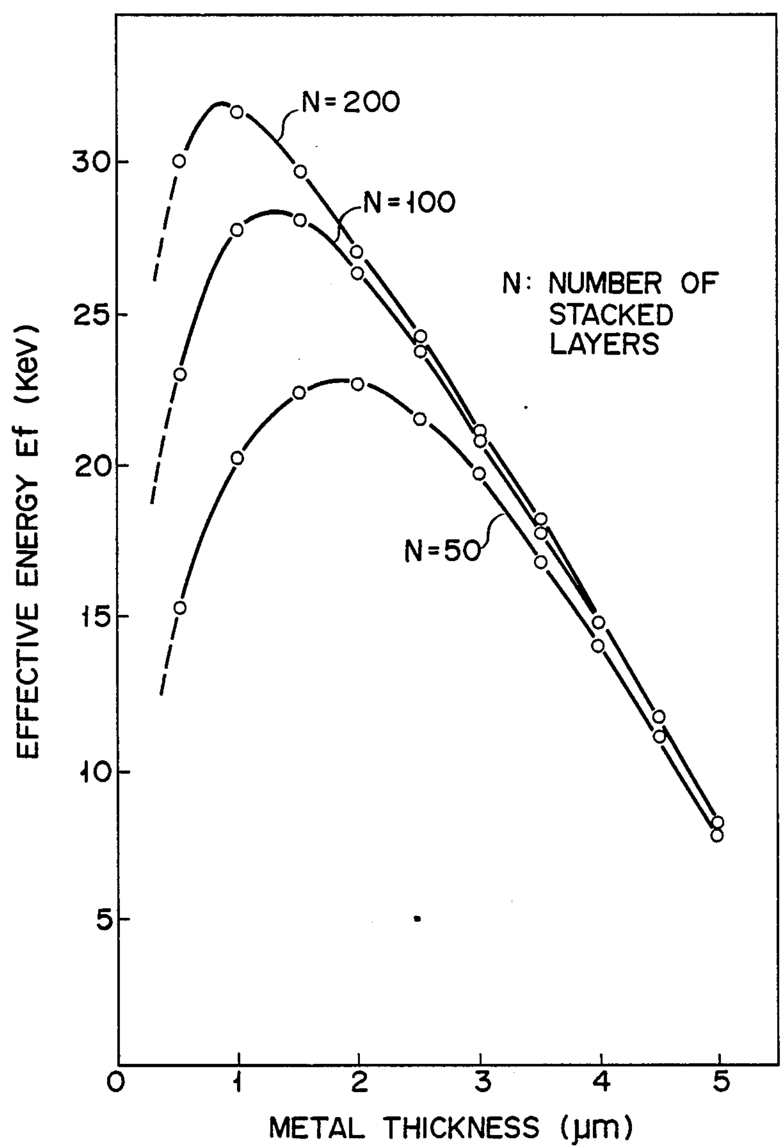

FIG. 8 is a graph showing the measurement results when, in the structure shown in FIGS. 1 and 2, an Mo film is used as one metal layer 18, a Ta film is used as the other metal layer 16, the film thickness of amorphous silicon layer 14 is set to be 25 μm, the film thicknesses of the Mo and Ta films are fixed to be x and are plotted along the ordinate, and number N of stacked layers is used as a parameter. As shown in FIG. 8, effective energy Ef exhibits peak values with respect to the film thickness of the metal layer. In this case, when $N=200$, 100, and 50, the optimal film thicknesses are 0.9 μm, 1.2 μm, and 1.8 μm, respectively.

With radiation detector 10 according to the first embodiment of the present invention described above, incident radiation ray detection is performed based on production of photoelectrons due to interactions (mainly, photoelectric absorption effect) of first and second metal layers 16 and 18 which sandwich each amorphous silicon layer 14 therebetween and consist of specific metals having atomic numbers of "30" or higher. The photoelectrons have high energy, and are guided to corresponding silicon layer 14 so as to produce electron-hole pairs therein, which serve as signal charges. These electron-hole pairs are collected by metal layers 16 and 18. Radiation rays pass through the amorphous silicon layer at a decreased attenuation rate and are incident on the next cell. Generation and collection processes of electron-hole pairs are sequentially performed in the respective cell portions, and a pulse current constituting a radiation detecting signal is finally obtained. First and second metal layers 16 and 18 serve not only as photoelectron producing layers but also as signal charge collecting layers. Therefore, a signal charge production rate per unit energy of radiation rays of a detector (i.e., a conversion efficiency) can be improved. Furthermore, the collecting efficiency of charges can also be improved. Therefore, the detection sensitivity of the radiation detector can be improved. The multi-cell structure wherein a large number of detection cell portions are stacked on a substrate also contributes to an improvement in detection sensitivity.

Figure 9:
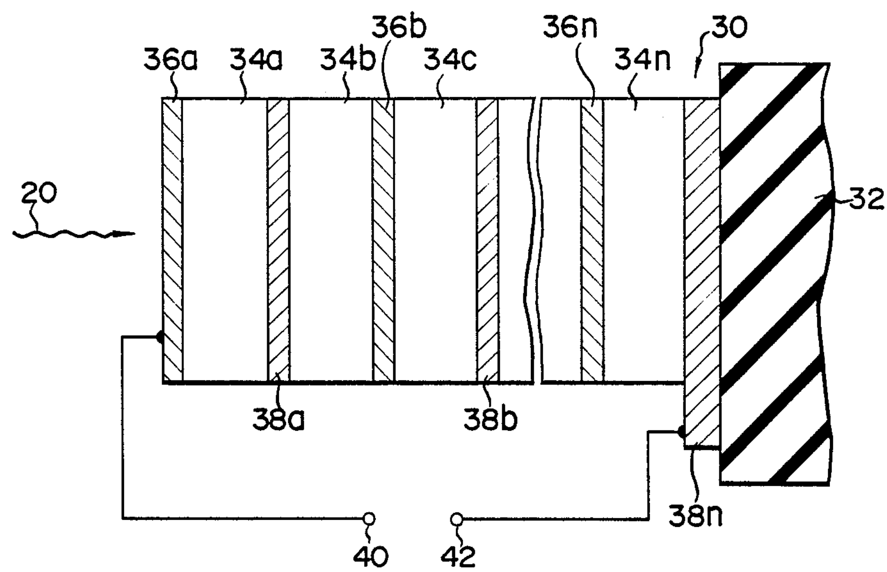
FIG. 9 is a view showing a modification of the laminating structure of the solid state radiation detector shown in FIG. 1.

FIG. 9 illustrates the arrangement of solid state radiation detector 30 according to a second embodiment of the present invention. Referring to FIG. 9, X-rays incident on the detector are designated by a wavy line denoted by reference numeral "20", as in the first embodiment.

X-ray detecting cells are stacked on insulative substrate 32. The multi-layered structure of these cells is basically the same as that in the first embodiment, and semiconductor layers and metal layers are alternately disposed on substrate 32. The semiconductor layers may be undoped amorphous silicon layers 34. The metal layers consist of Au layers 36 serving as Schottky junction metal layers and Mo layers 38 serving as ohmic contact metal layers. Metal layers 36 and 38 are alternately disposed between amorphous silicon layers **34*a*, 34*b*, 34*c*, . . . , 34*n*. Au layer 36*a* located at the top position of the multi-layered structure of detector 30 and Mo layer 38*n* located at the bottom position are connected to signal charge output terminals 40 and 42. Thus, it can be considered that layers 34, 36, and 38 are electrically connected in series with each other. The film formation method and the film thicknesses of these layers 34, 36, and 38** are the same as those in the first embodiment. With this structure, the same effect as described above can be obtained.

Figure 10:
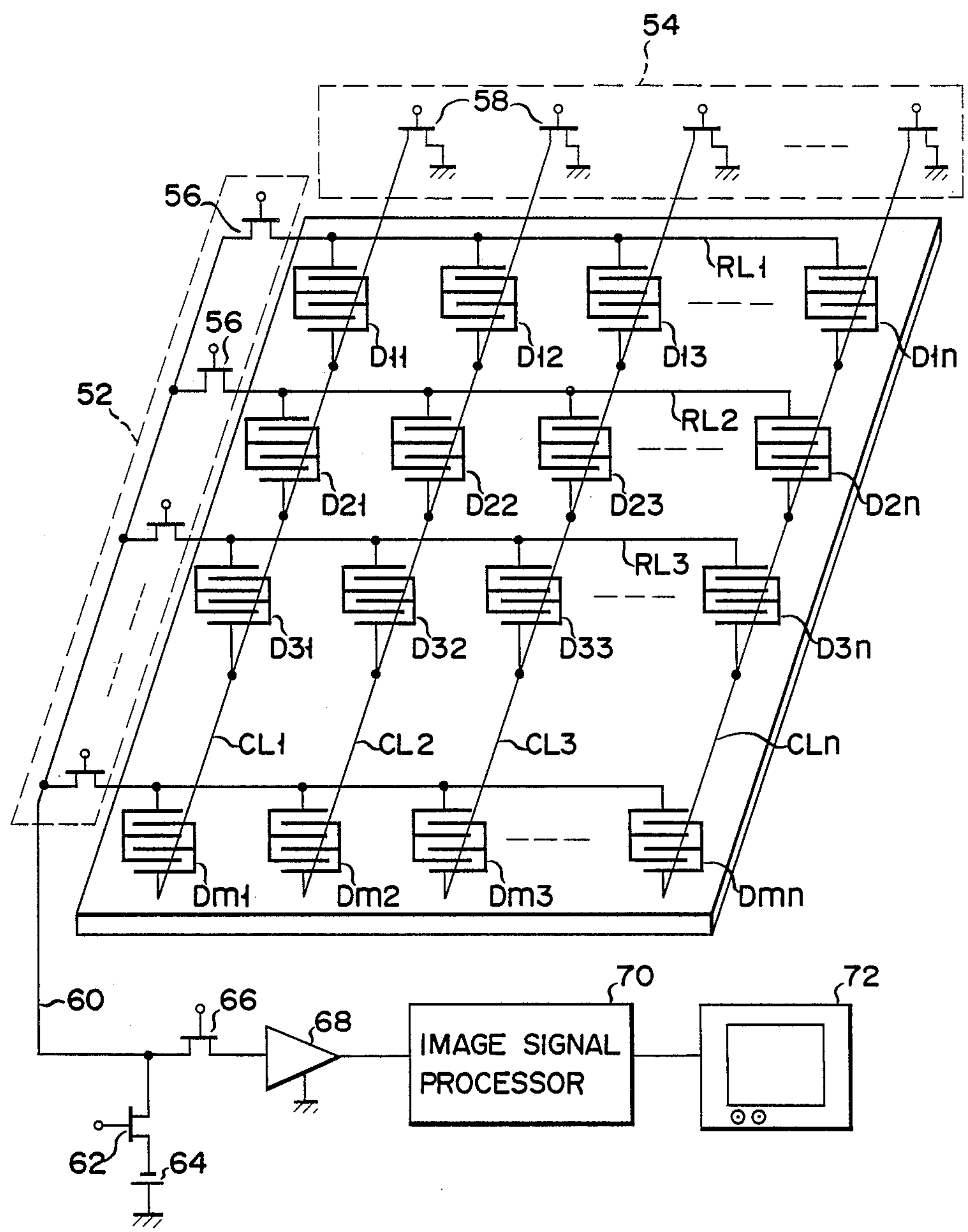
FIG. 10 is a diagram schematically showing the entire structure of a two-dimensional X-ray image sensing device wherein the solid state radiation detector of the present invention is used as pixel sensors.

FIG. 10 schematically shows the overall arrangement of a two-dimensional X-ray image sensing device as an application of an X-ray detector having the aforementioned structure. The X-ray image sensing device is suitable for an image accumulation medium which is known as an imaging panel of a medical image processing system for temporarily accumulating a sensed digital X-ray image.

Referring to FIG. 10, plate-shaped substrate 50 is composed of a transparent insulative plate, e.g., a glass plate. X-ray detecting elements D are two-dimensionally arranged on substrate 50 in a matrix. Since X-ray detecting elements D define M (rows)×N (columns) matrix, reference numerals in FIG. 10 of these elements D are determined with row and column numbers as suffixes, like "D11", "D12", . . . , "D1n", . . . , "Dmn". (However, in the following description, when these detectors need not be individually identified, suffixes are omitted. This also applies to other constituting elements). X-ray detecting elements D serve as picture elements or pixels when an incident X-ray image is sensed/read. On the matrix arrangement of detecting elements D, M row address lines RL1, RL2, . . . , RLm and N column address lines CL1, CL2, . . . , CLn are electrically separated from each other, and are arranged above substrate 50 to be perpendicular to each other, as shown in FIG. 10.

Figure 11:
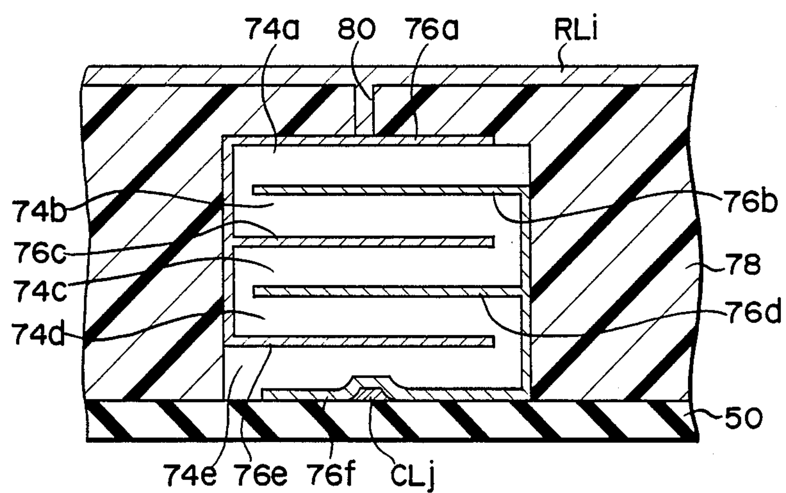
FIG. 11 is a diagram showing a sectional structure of one of X-ray detecting elements arranged on an X-ray the image sensing panel in a matrix.

Switching selectors 52 and 54 are respectively connected to row address lines RL and column address lines CL. Row selector 52 has parallel switching elements 56 which are respectively connected to row address lines RL1, RL2, . . . , RLm. Column selector 54 has parallel switching elements 58 which are respectively connected to column lines CL1, CL2, . . . , CLn. These switching elements 56 and 58 each comprise known field effect transistors. One electrode of each of switching transistors 56 of row selector 52 is connected to signal readout line 60, as shown in FIG. 11. The gate electrodes of transistors 56 and 58 are connected to a known address driver (not shown). Signal line 60 is connected to switching transistor 62 for pre-charging detecting elements D, and to D.C. battery 64 which serves as a D.C. power supply. Signal line 60 is also connected to monitor display unit 72 for displaying a sensed digital X-ray image via switching transistor 66 for controlling the readout operation of an image signal, amplifier 68, and image signal processor 70.

Each X-ray detecting element or detector D has a laminated multi-cell structure. More specifically, each detector D has a multi-layered structure where heavy metal layers **76*a*, 76*b*, 76*c*, 76*d*, 76*e*, and 76*f* made of a metal having an atomic number of "30" or higher (e.g., molybdenum) and undoped amorphous silicon layers 74a, 74b, 74c, 74d, and 74e are alternately stacked above one surface of substrate 50, as illustrated in the enlarged view of FIG. 11**. These metal layers have a function for producing photoelectrons mainly by the photoelectric absorption effect and a function for collecting electron-hole pairs produced in the amorphous silicon layers as a result of photoelectron production.

It should be noted that, according to this third embodiment, the stacked metal layers consist of one type of metal layers 76a, 76b, 76c, 76d, 76e, and 76f consisting of molybdenum, for example. These metal layers are alternately connected in common to their one end sides. For example, metal layers 76a, 76c, and 76e are conducted to each other, and are electrically separated from the multi-layered structure of remaining metal layers 76b, 76d, and 76f. As a result, the metal layers define a pair of tooth-shaped sectional shapes meshed with each other, in the same manner as in the first and second embodiments, as clearly illustrated in FIG. 11. With this multi-layered structure, since each semiconductor layer having a relatively high insulative property is sandwiched between two metal layers, the multi-layered structure equivalently forms a multi-layered capacitor.

Since each detecting element Dij is surrounded by polyimide insulative layer 78, each detecting element Dij is electrically separated from other detecting elements. One group of metal layers 76a, 76c, and 76e of one detecting element Dij are connected to corresponding row address lines RLi through contact hole 80 formed in insulative layer 78. The other group of metal layers 76b, 76d, and 76f are conducted to corresponding column address lines CLj provided between bottom metal layer 76f and substrate 50.

The operation mode of the X-ray image sensing panel in which the radiation detector of the present invention is applied to each pixel will be described below. Prior to radiation of an X-ray image, control transistor 66 is rendered nonconductive, and all the switching transistors 56 and 58 of the row and column selectors 52 and 54 are rendered conductive. Pre-charging transistor 62 is rendered conductive, thereby connecting D.C. battery 64 to row selector 52, so that all the radiation detecting elements D are pre-charged. As a result, pre-charged charges are accumulated in a saturation state on capacitor portions of detecting elements D each of which is equivalently formed by an amorphous silicon layer and two metal layers sandwiching the silicon layer therebetween. In this case, it can be equivalently considered that each detecting element Dij has a multi-layered capacitor structure.

After completion of pre-charging of detecting elements D, transistors 62 and transistors 56 and 58 of row and column selectors are rendered conductive. In this state, an X-ray image is incident on the two-dimensional array of detecting elements D for a predetermined period of time. Each detecting element D detects a pixel of the X-ray image radiated thereon as follows. The X-ray radiated portions of respective detecting elements Dij sequentially interact with Mo layers 76 (see FIG. 11), and produce photoelectrons having relatively high energy in these metal layers. The photoelectrons are transferred to corresponding amorphous silicon layer 74, and produce electron-hole pairs therein. These electron-hole pairs are recombined with the pre-charged charges accumulated on the capacitor portions consisting of the silicon layers and metal layers sandwiching the corresponding silicon layer, thereby neutralizing these charges. As a result of recombination, charges which still remain in amorphous silicon layer 74 are collected by metal layers 76.

Incident X-rays propagate from the top layer toward the bottom layer in each pixel detecting element, and pass through the multi-layered structure of metal layers 76 and amorphous silicon layers 74 while being gradually attenuated. In this manner, the incident X-rays sequentially repeat photoelectron production, electron-hole pair production, and pre-charged charge neutralization. When storing X-rays are radiated on detecting element Dij, since a larger number of electron-hole pairs are produced, the amount of remaining pre-charged charges is decreased, and a voltage across two terminals of the detecting element is decreased. Therefore, this voltage serves as a pixel image signal which electrically represents a negative image of a sensed X-ray image. The pixel signal voltage is held in each detecting element until the subsequent image readout operation starts. As a result, a charge image corresponding to two-dimensional illuminance distribution of the incident X-ray image is accumulated on the row and column arrangement of pixels (i.e., detecting elements) of the image sensing panel.

When control transistor 66 is rendered conductive, the X-ray image sensing panel is set in a readout (reproduction) mode of an accumulated charge image. At this time, column selector 54 is applied with addressing signals from an external driver (not shown), and one transistor is selected from switching transistors 58, thereby selectively enabling the corresponding column line. While one column line is enabled, row selector 54 receives drive signals from an external driver (not shown), and switching transistors 56 included therein are dynamically driven and sequentially rendered conductive. Thus, charge image data accumulated on the linear array of detectors D connected to selected column line CLi is time-serially read out therefrom. In other words, charges accumulated on one pixel detector Dij connected to designated row and column lines RLi and CLj are transferred as a pixel signal to the corresponding selector transistor through row line RLi. Since row lines RL are sequentially designated, pixel signals from an array of detectors D associated with the selected column line are sequentially derived onto signal line 60. Since column lines CL are sequentially selected in accordance with dynamic address scanning, all pixel data of the sensed X-ray image plane may be read out onto signal line 60 in a time-divisional manner.

A series of electrical pixel signals output from row selector 52 onto signal line 60 in a predetermined time order are supplied to amplifier 68 through transistor 66, and are amplified thereby. The amplified pixel signals are supplied to image signal processor 70, and produce an electrical frame image signal corresponding to the X-ray image sensed by the panel. The reproduced image signal is supplied to display unit 72, and is displayed on the display screen.

According to the X-ray image sensing panel having pixel image detectors D of the present invention metal layers 76 serve not only as photoelectron producing means but also as a means for collecting pre-charged charges (i.e., pixel signal charges) which remain as a result of recombination with electron-hole pairs produced in amorphous silicon layers 74. Therefore, pixel image signals can be sensed at high sensitivity by each X-ray detector Dij. If the thicknesses of amorphous silicon layers 74 are appropriately decreased, a travel time of signal charges can be shortened, and response time of the X-ray image sensing operation can be improved.

Furthermore, since the pixel image signals are electrically read out from X-ray detectors D, sensing and reproduction processing of the X-ray image can be performed at high speed, i.e., in a real-time manner. This is because each detector D having the multi-layered structure consisting of amorphous silicon layers 74 and metal layers 76 is equivalent to the multi-layered capacitor which senses incident X-rays to produce corresponding signal charges and accumulates them therein. The signal charges accumulated on the multi-layered capacitor can be read out at high speed by a simple electrical signal readout circuit using dynamic drive technique of row and column addressing. For the same reason, charge image data representing the sensed X-ray image can be kept accumulated on the panel for a desired period of time, if needed. In this case, the panel of this embodiment can be used in an application similar to chemical X-ray film.

Figure 12:
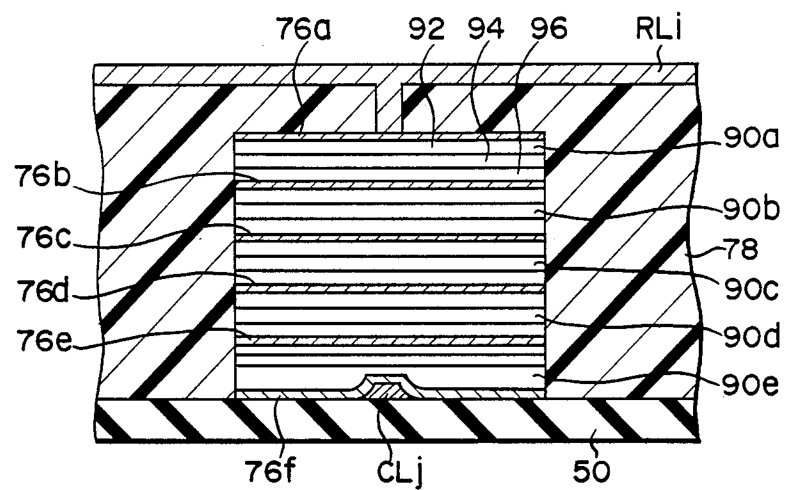
FIGS. 12 and 13 are diagrams showing modifications of the multi-layered structure of the detector shown in FIG. 11.
Figure 13:
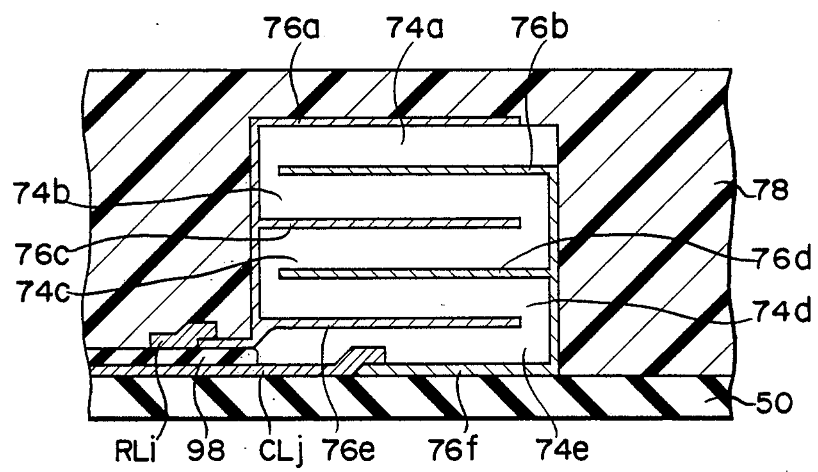

FIGS. 12 and 13 show modifications of the multi-layered structure of the X-ray detector shown in FIG. 11. The same reference numerals in FIGS. 12 and 13 denote the same parts as in FIG. 11. According to the modification shown in FIG. 12, each amorphous silicon layer of each detector D is replaced with semiconductor, layer *90a, 90b, 90c, 90d,* or *90e,* having the PIN structure with the multi-layered structure consisting of p-type silicon layer 92, intrinsic silicon layer 94, and n-type silicon layer 96. Mo layers *76a, 76b, 76c, 76d, 76e,* and *76f* are provided between adjacent PIN semiconductor layers *90a, 90b, 90c, 90d,* and *90e,* in such a manner that cells are electrically connected in series with each other. According to the modification shown in FIG. 13, row address line RLi is arranged above column address line CLj formed on insulative substrate 50. Insulative thin-film layer 98 is formed between row and column lines RLi and CLi to electrically isolate them.

Figure 14:
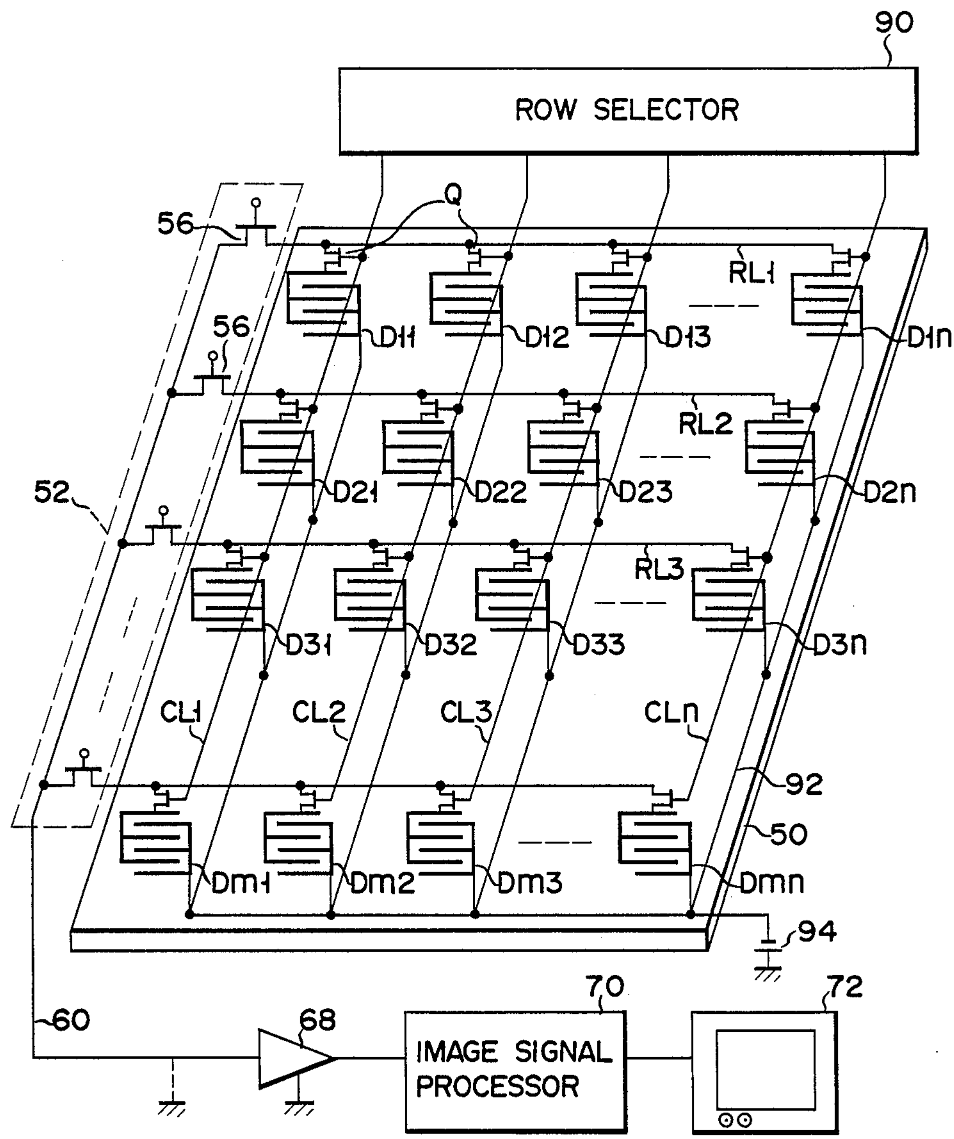
FIG. 14 is a diagram schematically showing the entire structure of another two-dimensional image sensing device wherein the solid state radiation detector of the present invention is used as a pixel sensor unit.

The basic difference between a two-dimensional image sensing device shown in FIG. 14 and the device shown in FIG. 10 is that thin-film transistor (to be referred to as "TFT" hereinafter) Q serving as a switching element is provided between each X-ray detector serving as a picture element and corresponding row address line R1. In FIG. 14, the same reference numerals denote the same constituting elements as in FIG. 10, and a detailed description thereof will be omitted.

In each X-ray detector Dij, the source electrode of FET Qij is connected to row line RLi, and the drain electrode thereof is connected to one metal layer of X-ray detector Dij. The gate electrode of FET Qij is connected to one column line CLj of column lines CL. Column lines CL are connected to column selector 90 for sequentially selecting column lines. Common bias line 92 is connected to biasing d.c. battery 94. Pixel data signals sequentially read out from row selector 52 are output onto signal line 60. Signal line 60 is connected to display unit 72 through amplifier 68 and image signal processor 70 in the same manner as in FIG. 10. In this embodiment, since signal line 60 is equivalently grounded, a connecting line between line 60 and the ground potential is illustrated as a dotted line in FIG. 14.

Figure 15:
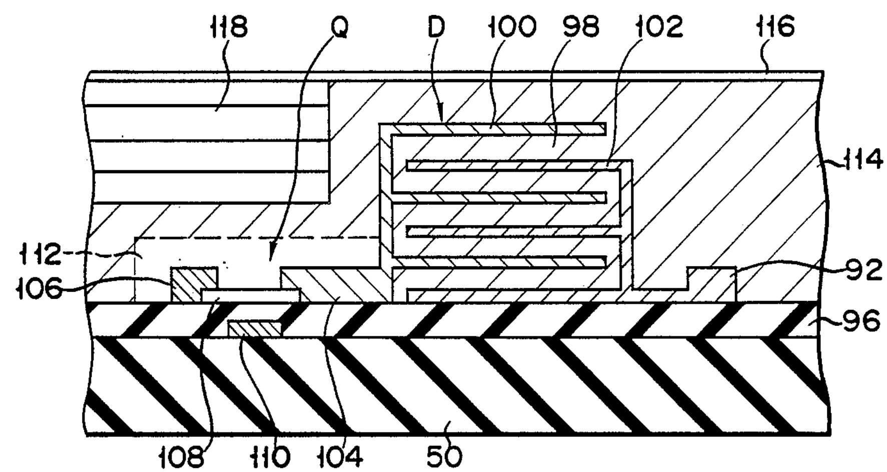
FIG. 15 is a diagram showing a sectional structure of one of the pixel units which are arranged on an X-ray image sensing panel of FIG. 14 in a matrix and each of which has an X-ray detecting element and a thin-film transistor connected thereto.

Each X-ray detector D is arranged on silicon oxide layer 96 formed on glass substrate 50. Each X-ray detector D has a multi-layered structure in which metal layers for producing photoelectrons in response to incident X-rays, and amorphous silicon layers, sandwiched therebetween, for producing electron-hole pairs are alternately stacked. The multi-layered structure is the same as those in the above embodiments. In this embodiment, the metal layers consist of tantulum (Ta) layers 100 and molybdenum (Mo) layers 102. First metal layers (Ta layers) 100 are electrically connected at their end portions, as shown in FIG. 15, and are connected to layer 104 which is formed to be located on one side of the multi-layered structure. Ta layer 104 serves as the drain electrode of TFT Qij. Mo layers 102 are also electrically connected to each other at their end portions. Second metal (Mo) layers 102 are formed on silicon oxide layer 96 so as to be located on the other side portion of the multi-layered structure, and are connected to the metal layer serving as bias line 92.

TFT Q is formed on silicon oxide film 96 to be adjacent to X-ray detector D. TFT Q has aluminum layer 106 which is formed on silicon oxide film 96 to spatially face Ta layer 104 and serves as a source electrode, and intrinsic amorphous silicon layer 108 which is formed on layer 96 to be in contact with layers 104 and 106 and serves as a channel region. These layers 104, 106, and 108 are electrically insulated from Mo layer 110 which is formed on substrate 50 and serves as the gate electrode of TFT Q. TFT Q is covered with polyimide passivation layer 112. Furthermore, TFT Q and X-ray detector D are covered with amorphous silicon layer 114. Insulative protective thin-film layer 116 is formed on the top surface of layer 114. X-ray shielding layer 118 is formed on a portion of amorphous silicon layer 114 located above TFT Q, and protects TFT Q from X-rays.

Prior to X-ray image sensing, all the X-ray detectors D are reverse-biased by biasing battery 94. Each detector Dij are pre-charged, and charges are accumulated on the multi-layered capacitor formed by the multi-layered structure of amorphous silicon layer 98, and metal layers 100 and 102. When an X-ray image is incident on the panel, photoelectrons are produced in metal layers 100 and 102 in accordance with the intensity distribution of the incident image, and the photoelectrons are guided to amorphous silicon layers 98. The photoelectrons are converted to electron-hole pairs in amorphous silicon layers 98. These electron-hole pairs are recombined with pre-charged charges, thereby decreasing an amount of charges accumulated on detector D. Remaining charges are collected by metal layers 100 and 102. When TFTs Q are sequentially selected by row and column selectors 52 and 54 using substantially the same technique as the dynamic addressing technique in the embodiment shown in FIG. 10, charges accumulated on X-ray detector Dij connected to selected TFT Qij are read out as pixel signals.

Although the invention has been described with reference to a specific embodiment, it shall be understood by those skilled in the art that numerous modifications may be made that are within the spirit and scope of the invention.

For example, the substrate can comprise an insulative substrate such as various other glass substrates, alumina substrate, sapphire substrate, and the like, in addition to the quartz substrate. Also, the substrate can comprise a metal substrate.

The semiconductor layers in the multi-layered structure can consist of other amorphous semiconductors, such as germanium, selenium, gallium, and the like in place of amorphous silicon. Alternatively, organic semiconductor, micro-crystalline semiconductor, polycrystalline semiconductor, or a combination thereof can be used in place of the amorphous semiconductor.

The semiconductor layer need not always be an undoped layer, and an impurity can be doped therein. In addition, a pn, pin, pi, or ni structure can be employed, or a tandem structure of these structures can also be adopted.

As the metal layers, metals having atomic numbers of 30 or more can be appropriately selected. In the above embodiments, one metal layer which is in contact with an amorphous silicon layer forms a Schottky barrier with the amorphous silicon layer, and the other metal layer is in ohmic-contact with the amorphous silicon layer. This structure is employed so as to read out a signal at a zero bias or a bias near zero. However, any metal layer can be composed of a material which is in ohmic-contact with the silicon layer, so that a current can be read out upon application of a voltage. A metal layer between adjacent amorphous silicon layers need not be a single layer but can be a multi-layered film consisting of a metal layer which is in ohmic-contact with the amorphous silicon layer and a metal layer which forms the Schottky barrier. The metal layers include a metal layer which has a small atomic number and is used simply as an ohmic electrode. Furthermore, when radiative isotope $^{10}B$ is doped in the metal layer, the device of the present invention can be effectively used as a neutron detector. In this case, the metal layer produces $\alpha$ ray, which is introduced into an adjacent semiconductor layer.

Various types of radiation particles, such as high energy electrons, may be detected by the aforementioned multi-layered structure of this invention, utilizing interaction between the particles and metal layers.

What is claimed is:

1. A solid state radiation detecting device comprising:

a semiconductor layer; and a metal layer formed on said semiconductor layer for receiving radiation rays and for producing, based on interactions therewith, energy particles which are introduced into said semiconductor layer and excite said semiconductor layer so as to produce electron-hole pairs, said metal layer comprising metal selected from the group consisting of metals having atomic numbers of at least 30, said metal layer having a specific thickness smaller than a range of the energy particles produced therein to maximize the efficiency of production of the electron-hole pairs, said specific thickness being large enough to enable said metal layer to serve as a collector electrode for collecting the electron-hole pairs to provide carriers for producing an electrical radiation detecting signal.

2. A device according to claim 1, wherein: said semiconductor layer is an undoped amorphous silicon layer.

3. The device according to claim 1, wherein said metal layer includes a Schottky junction metal layer forming a Schottky barrier between itself and said semiconductive layer.

4. The device according to claim 1, wherein said metal layer includes an ohmic contact metal layer which is in ohmic-contact with said semiconductive layer.

5. The device according to claim 1, wherein said semiconductive layer consists of an amorphous semiconductor.

6. The device according to claim 1, wherein said semiconductive layer comprises a semiconductor layer having a pn junction structure.

7. The device according to claim 1, wherein said semiconductive layer comprises a semiconductor layer having a pin junction structure.

8. A solid state radiation detecting device, comprising:

detecting cell portions which are stacked to substantially vertically receive incident radiation rays, each of said detecting cell portions comprising, a plurality of semiconductor layers, and a plurality of metal layers which are alternately provided between adjacent semiconductor layers so that two neighboring metal layers sandwich a semiconductor layer, each of said metal layers receiving incident radiation rays producing free energy particles, said free energy particles are then introduced into the corresponding adjacent semiconductor layers and excite the corresponding adjacent semiconductor layers so as to produce electron-hole pairs therein, and for collecting the electron-hole pairs to obtain carriers for producing an electrical radiation detecting signal;

said plurality of metal layers are selected from the group consisting of metals having an atomic number of at least 30;

said plurality of metal layers having a specific thickness smaller than a range of the energy particles produced therein to maximize the efficiency of production of the electron hole pairs, and said specific thickness being large enough to enable said plurality of metal layers to serve as a collector electrode for collecting the electron hole pairs to provide carriers for producing an electrical radiation detecting signal.

9. The device according to claim 8, wherein said metal layers include:

a first metal layer for forming a Schottky barrier between itself and said semiconductor layer; and a second metal layer which is in ohmic-contact with said semiconductor layer.

10. The device according to claim 9, wherein said first and second metal layers are alternately arranged between the adjacent semiconductor layers.

11. The device according to claim 10, wherein said first and second metal layers are electrically connected in series with each other.

12. The device according to claim 10, wherein said first and second metal layers are electrically connected in parallel with each other.

13. A device according to claim 8, wherein:

said plurality of semiconductor layers are undoped amorphous silicon layers.

14. The device according to claim 8, wherein said two neighboring metal layers comprise:

metal layers which are in ohmic-contact with the corresponding semiconductor layer.

15. A device for sensing a radiation image, comprising:

a substrate;

pixel sensors which are two-dimensionally arranged on said substrate to define rows and columns, said sensors comprising solid state radiation detectors each of which has semiconductor layers and metal layers which are stacked along the incident direction of the incident radiation image, said metal layers being alternately arranged between the adjacent semiconductor layers, so that two neighbouring metal layers sandwich the corresponding semiconductor layer therebetween and equivalently constitute a capacitor, and said metal layers selectively receiving the incident radiation image so as to produce free energy particles by interactions therewith, which are introduced into and excite said semiconductor layers so as to produce electron-hole pairs; and image signal readout means connected to said rows and columns of said radiation detectors, for precharging said radiation detectors so as to initially accumulate charges thereon, and for reading out the charges which remain after recombination of the charges and the electron-hole pairs produced in said semiconductor layers of each pixel sensor, and are collected by said metal layers, thereby obtaining an electrical image signal corresponding to the incident radiation image; and wherein each of said metal layers is selected from the group having an atomic number of at least 30;

each of said metal layers having a specific thickness smaller than a range of the energy particles produced therein to maximize the efficiency of the electron-hole pairs, and said specific thickness being large enough to enable said plurality of metal layers to serve as a collector electrode for collecting the electron hole pairs to provide carriers for producing an electrical radiation detecting signal.

16. The device according to claim 15, wherein said semiconductor layers comprise amorphous silicon.

17. A device according to claim 15, wherein: said semiconductor layers are undoped amorphous silicon layers.

18. a solid state radiation detecting device, comprising:

a pattern of alternating layers stacked one on top of another having a first semiconductor layer lying between a first Schottky junction metal layer and a first ohmic contact metal layer;

a second semiconductor layer lying between said first ohmic contact metal layer and a second Schottky junction metal layer;

a third semiconductor layer lying between said second Schottky junction metal layer and a second ohmic contact metal layer;

one end of said first semiconductor layer connecting to one end of said second semiconductor layer, and the other end of said second semiconductor layer connecting to an end of said third semiconductor layer;

one end of said first Schottky junction metal layer connecting to an end of said second Schottky junction metal layer; and, one end of said first ohmic contact metal layer connecting to an end of said second ohmic contact metal layer.

19. The device according to claim 18, wherein:

the pattern of alternating layers stacked one on top of another is repeated a predetermined number of times.

* * * * *